United States Patent
Koestler et al.

(10) Patent No.: US 11,227,969 B2
(45) Date of Patent: Jan. 18, 2022

(54) MARKING METHOD

(71) Applicant: AZUR SPACE Solar Power GmbH, Heilbronn (DE)

(72) Inventors: Wolfgang Koestler, Heilbronn (DE); Steffen Sommer, Tamm (DE); Alexander Frey, Heilbronn (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 18 days.

(21) Appl. No.: 17/007,629

(22) Filed: Aug. 31, 2020

(65) Prior Publication Data
US 2021/0066536 A1    Mar. 4, 2021

(30) Foreign Application Priority Data
Aug. 29, 2019   (DE) .................. 10 2019 006090.3

(51) Int. Cl.
*H01L 31/18*    (2006.01)
*H01L 23/544*    (2006.01)
(Continued)

(52) U.S. Cl.
CPC ........ *H01L 31/1876* (2013.01); *H01L 23/544* (2013.01); *H01L 31/02167* (2013.01);
(Continued)

(58) Field of Classification Search
CPC .............. H01L 31/186; H01L 31/1876; H01L 31/02167; H01L 31/0336; H01L 31/0687;
(Continued)

(56) References Cited

U.S. PATENT DOCUMENTS

2004/0166444 A1*  8/2004  Kiso ..................... G06K 1/121
                                              430/311
2007/0163634 A1*  7/2007  Wada ................ H01L 21/67294
                                              136/252
(Continued)

FOREIGN PATENT DOCUMENTS

DE    10 2009 009 499 A1    8/2010
TW         201120594 A1     6/2011

OTHER PUBLICATIONS

Swart et al., "Assessment of the overall resource consumption of germanium wafer production for high concentration photovoltaics," Resources, Conservation & Recycling, vol. 55, No. 12, pp. 1119-1128 (Jun. 29, 2011).
(Continued)

*Primary Examiner* — Earl N Taylor
(74) *Attorney, Agent, or Firm* — Muncy, Geissler, Olds & Lowe, P.C.

(57) ABSTRACT

A marking method for applying a unique identification to each individual solar cell stack of a semiconductor wafer, at least comprising the steps: Providing a semiconductor wafer having an upper side and an underside, which comprises a Ge substrate forming the underside; and generating an identification with a unique topography by means of laser ablation, using a first laser, on a surface area of the underside of each solar cell stack of the semiconductor wafer, the surface area being formed in each case by the Ge substrate or by an insulating layer covering the Ge substrate.

7 Claims, 1 Drawing Sheet

(51) Int. Cl.
 *H01L 31/0216* (2014.01)
 *H01L 31/0336* (2006.01)
 *H01L 31/0687* (2012.01)
 *H01L 31/078* (2012.01)

(52) U.S. Cl.
 CPC ........ *H01L 31/186* (2013.01); *H01L 31/0336* (2013.01); *H01L 31/0687* (2013.01); *H01L 31/078* (2013.01); *H01L 2223/54413* (2013.01)

(58) Field of Classification Search
 CPC ......... H01L 31/078; H01L 2223/54433; H01L 21/67294; H01L 23/544; G06K 1/121; G06K 1/126
 See application file for complete search history.

(56) References Cited

U.S. PATENT DOCUMENTS

| | | |
|---|---|---|
| 2009/0050198 A1 | 2/2009 | Mueller et al. |
| 2016/0064334 A1 | 3/2016 | Bishop et al. |
| 2016/0172306 A1 | 6/2016 | Scanlan |
| 2019/0181289 A1 | 6/2019 | Derkacs et al. |

OTHER PUBLICATIONS

Yang et al., "Research on Laser Marking Technology of Ge Wafers," Bandaoti Jishu—Resesarch Tech, vol. 34, No. 7, pp. 676-678 (Jun. 30, 2009) with Engish Translation.

Niemeyer et al., "Next Generation of Wafer-Bonded Multi-Junction Solar Cells," 29$^{th}$ European Solar Energy Conf., Munich, Germany pp. 1991-1995 (2014).

\* cited by examiner

MARKING METHOD

This nonprovisional application claims priority under 35 U.S.C. § 119(a) to German Patent Application No. 10 2019 006 090.3, which was filed in Germany on Aug. 29, 2019, and which is herein incorporated by reference.

BACKGROUND OF THE INVENTION

Field of the Invention

The present invention relates to a marking method for applying a unique identification to each individual solar cell stack of a semiconductor wafer.

Description of the Background Art

In manufacturing semiconductor components, traceability is an important tool for monitoring and optimizing processes. To make solar cell stacks traceable, they are provided with a unique identification, e.g. a continuous number. For example, solar cell stacks are marked by means of an ink jet process following final inspection. Marking methods for unprocessed semiconductor substrates are known from DE 10 2009 009 499 A1, wherein the marking is arranged on the rear side of the substrate.

A marking method for solar cells is known from US 2009/0050198 A1, wherein the marking is arranged in an active area of the solar cell, that is to say on a solar cell front side. The marking is applied, for example, by means of laser ablation to a front side of a semiconductor substrate, before the solar cell is produced by diffusing dopants and applying conductor tracks on the front side of the semiconductor substrate.

The arrangement of marking structures on the front side of a solar cell is also known from US 2019/0181289 A1.

US 2016/0064334 A1 discloses a marking method for chips prior to separation, that is to say at wafer level, wherein the marking is formed as part of the rear-side contacting structure.

From US 2016/0172306 A it is known to arrange a marking on the front side of each chip prior to separation.

SUMMARY OF THE INVENTION

It is therefore an object of the present invention to provide a device which refines the prior art.

According to an exemplary embodiment of the invention, a marking method is provided for applying a unique identification to each individual solar cell stack of a semiconductor wafer, at least comprising the steps of providing a semiconductor wafer, which has an upper side, an underside and which comprises a Ge substrate forming the underside, and generating an identification with a unique topography by means of laser ablation, using a first laser, on a surface area of the underside of each solar cell stack of the semiconductor wafer, the surface area being formed in each case by the Ge substrate or by an insulating layer covering the Ge substrate.

The identification may be formed as an arbitrary pattern, such as a bar code or a 2D code or a matrix code or also as a sequence of numbers and/or letters, which is uniquely identifiable.

The Ge semiconductor wafer, which can have a diameter of 100 mm or 150 mm, comprises at least two solar cell stacks. The two solar cell stacks are preferably separated from one another on the upper side of the semiconductor wafer by means of a separation region.

The solar cell stack can be a multi-junction solar cell. Such multi-junction solar cells have several p/n junctions, wherein the p/n junctions are connected in series via tunnel diodes. In a further development, the stack of multi-junction solar cells can be monolithic.

Trenches/indentations of different depths can be generated in the surface area of the solar cell stack underside by means of laser ablation, so that the unique topography results, the depth depending on the energy input in each case.

A unique topography may be easily, quickly and reliably generated by means of laser ablation.

By marking the individual solar cells together with the semiconductor wafer, i.e. before separation or on the wafer level, only one single adjustment step needs to be carried out for all solar cell stacks of the semiconductor wafer. In addition, the individual solar cell stacks are already uniquely identified from this early point in time in the manufacturing process onward without any further documentation.

A pulsed laser having a wavelength between 1,070 nm and 315 nm or between 1.5 µm and 10.6 µm may be used for the laser ablation, and/or a pulse duration is between 10 fs and 100 ns. Also, a laser can be used, which has a wavelength between 1,030 nm and 1,070 nm and a pulse duration of at least 500 fs and no more than 30 ns. A diameter of the focus point is, for example, between 20 µm and 40 µm, e.g. with a focal length of approximately 160 mm.

Since lasers are frequently already present for other process steps, such as generating through-openings and/or separating trenches, little additional complexity is necessary for the marking method according to the invention.

An etching process, using a first etching solution, can be carried out for cleaning and deepening the topography of the identifications.

The energy input of the laser ablation and/or the process time may be reduced by the additional deepening of the topography by means of an etching process, a sufficient depth, and thus an increased contrast of the identification, being achievable.

Furthermore, damage due to an excessive heat input may be reliably avoided. A subsequent etching process also ensures that possible impurities are reliably removed.

Since the process technology, i.e. a corresponding etching process, is frequently already present for the further manufacturing process, this additional process step means very little or no additional complexity.

Another advantage is that the rear side has only slight local indentations of just a few micrometers after the formation of the markings. An induction of cracks during the further process steps is suppressed hereby.

The surface area formed by the Ge substrate can be metal-plated together with the underside of the Ge substrate after the unique identifications are applied.

The identification is thus protected by the metal layer against environmental influences or changes, and it remains recognizable due to the metal layer. This also ensures that the heat input for generating the identification is not able to damage the metal plating.

The solar cell stack of the semiconductor wafer can be separated after the unique identification is applied.

The identification can be carried out prior to a growth of layers on the Ge substrate. No damage may thus occur due to the heat input and the ablation dust generated by the marking process.

The identification can be carried out only after a growth of layers on the Ge substrate. The identification can be carried out after the application of insulating layers to the front side.

The semiconductor wafer comprises multiple solar cell stacks, preferably more than two or more than three, each solar cell stack including the Ge substrate forming the underside, a Ge subcell and at least two III-V subcells in the specified order in each case. In this case, the subcells are understood to be solar subcells, wherein each solar subcell has exactly one p/n junction.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus, are not limitive of the present invention, and wherein.

DETAILED DESCRIPTION

Figure 1:
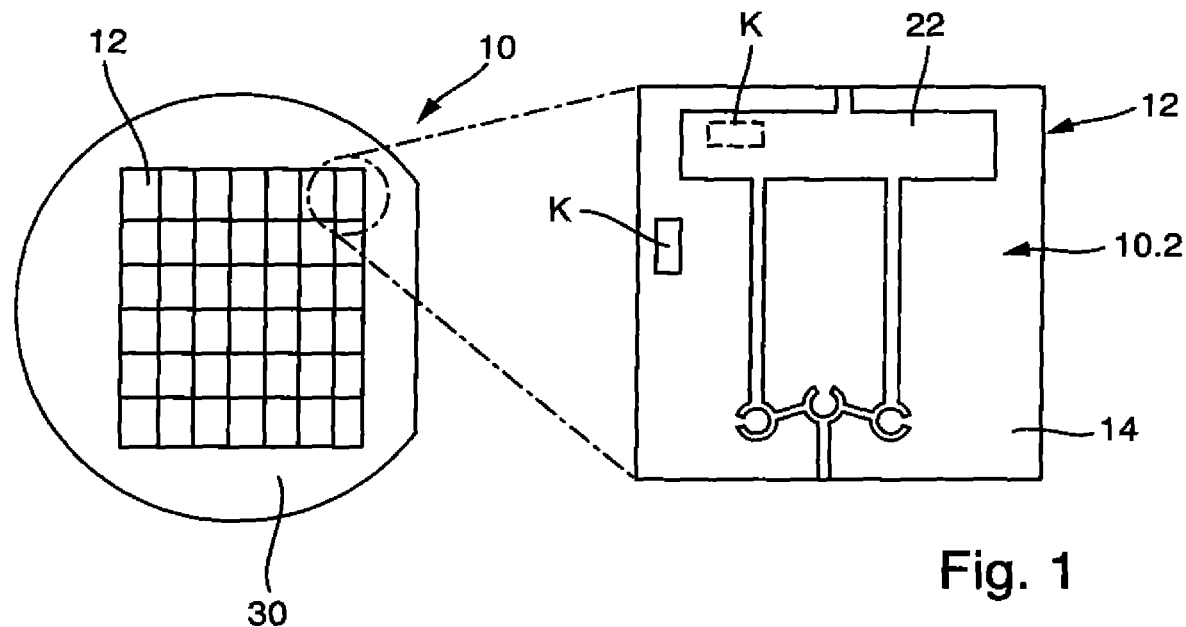
FIG. 1 shows a semiconductor wafer marked according to an exemplary embodiment of a marking method.

The illustration in FIG. 1 shows a top view of a semiconductor wafer 10 marked according to a first specific embodiment of a marking method. The semiconductor wafer has an upper side 10.1, an underside 10.2 as well as multiple solar cell stacks 12, each solar cell stack comprising at least one Ge substrate 14 forming underside 10.2.

Underside 10.2 has a dielectric insulating layer 22 formed in regions in each case on the Ge substrate in the area of each solar cell stack 12. Each solar cell stack 12 has a surface with a unique identification K on underside 10.2, identification K or the surface area being formed on Ge substrate 14. Alternatively, identification K or the surface area is formed on dielectric insulating layer 22 (illustrated by the dashed line).

Figure 2:
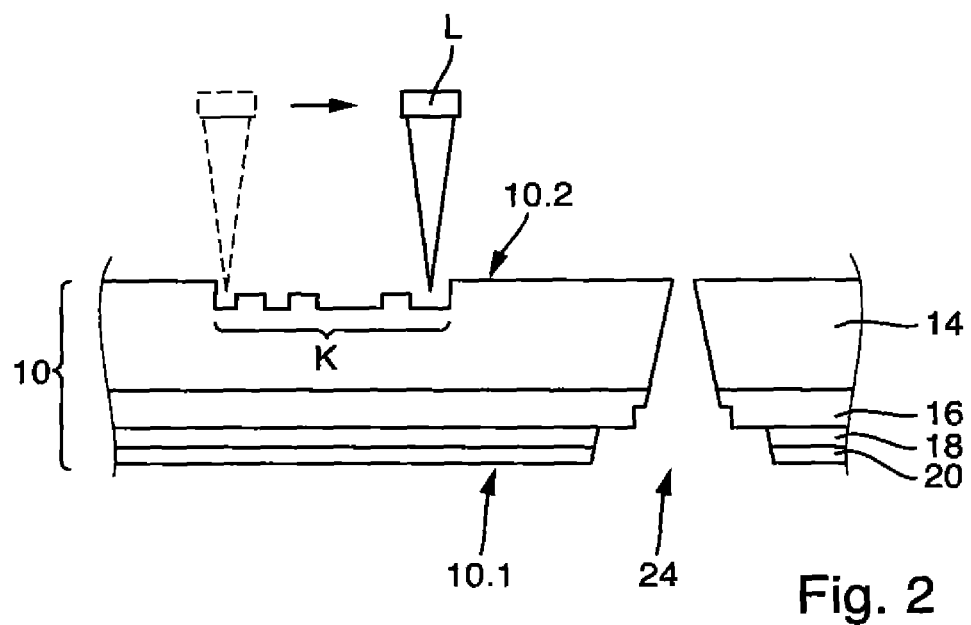
FIG. 2 shows a schematic sequence of the marking method.

Another example is shown in the illustration in FIG. 2. Only the differences from the illustration in FIG. 1 are explained below.

A detail of semiconductor wafer 10 illustrated in cross section has a Ge subcell 16 on Ge substrate 14 forming underside 10.2, a first III-V subcell 18 and second III-V subcell 20 forming an upper side 10.1 of semiconductor wafer 10 in the specified order as well as a through-opening 24 extending from upper side 10.1 to underside 10.2.

Identification K is generated by means of laser ablation, using a first laser L. The identification comprises a unique topography on the surface area of underside 10.2 of semiconductor wafer 10.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A marking method for applying a unique identification to each individual solar cell stack of a semiconductor wafer comprising at least two solar cell stacks, the method comprising:
   providing a semiconductor wafer, which has an upper side and an underside, the underside comprising a Ge substrate; and
   generating an identification with a unique topography by laser ablation using a first laser on a surface area of the underside of the at least two solar cell stacks of the semiconductor wafer,
   wherein the surface area is formed by the Ge substrate or by an insulating layer covering the Ge substrate.

2. The method according to claim 1, wherein an etching process, using a first etching solution, is carried out after generating the unique identification for cleaning and deepening the topography of the identifications.

3. The method according to claim 1, wherein the surface area formed by the Ge substrate is metal-plated together with the underside of the Ge substrate after the unique identifications are applied.

4. The method according to claim 1, wherein the solar cell stacks of the semiconductor wafer are separated after the unique identification is applied.

5. The method according to claim 1, wherein the unique identification is carried out prior to a growth of layers on the Ge substrate.

6. The method according to claim 1, wherein the unique identification is carried out after a growth of layers on the Ge substrate.

7. The method according to claim 1, wherein the semiconductor wafer comprises multiple solar cell stacks, each solar cell stack having the Ge substrate forming the underside, a Ge subcell and at least two III-V subcells in the specified order in each case.

* * * * *